United States Patent
Chen et al.

(10) Patent No.: US 12,160,978 B2
(45) Date of Patent: Dec. 3, 2024

(54) LIQUID IMMERSION COOLING APPARATUS

(71) Applicants: INVENTEC (PUDONG) TECHNOLOGY CORPORATION, Shanghai (CN); INVENTEC CORPORATION, Taipei (TW)

(72) Inventors: Xue-Feng Chen, Shanghai (CN); Pin-Yi Xiang, Shanghai (CN); Ke Sun, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 279 days.

(21) Appl. No.: 17/985,161

(22) Filed: Nov. 11, 2022

(65) Prior Publication Data

US 2024/0090170 A1    Mar. 14, 2024

(30) Foreign Application Priority Data

Sep. 14, 2022  (CN) .......................... 202211116952.0

(51) Int. Cl.
  *H05K 7/20*    (2006.01)
(52) U.S. Cl.
  CPC ......... *H05K 7/203* (2013.01); *H05K 7/20327* (2013.01); *H05K 7/20381* (2013.01)
(58) Field of Classification Search
  None
  See application file for complete search history.

(56) References Cited

U.S. PATENT DOCUMENTS

| | | | | |
|---|---|---|---|---|
| 5,477,706 A | * | 12/1995 | Kirol | G06F 1/20 62/480 |
| 8,051,637 B2 | * | 11/2011 | Labrador | F03G 7/00 60/39.01 |
| 8,130,497 B2 | * | 3/2012 | Kondo | G06F 1/20 165/80.4 |
| 2014/0290305 A1 | * | 10/2014 | Kunze | F25B 17/02 62/476 |
| 2015/0181762 A1 | * | 6/2015 | Boyd | H05K 7/20236 165/104.33 |
| 2021/0219454 A1 | * | 7/2021 | Cheng | H05K 7/20318 |
| 2021/0410320 A1 | * | 12/2021 | Yang | H05K 7/20327 |
| 2022/0104403 A1 | * | 3/2022 | Heydari | B60H 1/3202 |
| 2022/0346283 A1 | * | 10/2022 | Himmelhuber | H05K 7/20781 |
| 2023/0080447 A1 | * | 3/2023 | Shah | H05K 7/20836 361/679.53 |

* cited by examiner

Primary Examiner — Xanthia C Relford

(57) ABSTRACT

A liquid immersion cooling apparatus includes a box, a cover and a refrigeration device. The cover and the box form a closed space. The closed space includes a liquid storage space configured to accommodate a first coolant and at least one heat generating device and a gas storage space. The refrigeration device is located in the gas storage space. The refrigeration device includes a coiled tube, a liquid-cooled heat exchanger, and a cooling chip. The liquid-cooled heat exchanger is connected to the coiled tube to form a first circulation channel. The first circulation channel is configured to accommodate a second coolant. The cooling chip includes a hot end and a cold end, the cold end is thermally coupled to the liquid-cooled heat exchanger.

10 Claims, 6 Drawing Sheets

LIQUID IMMERSION COOLING APPARATUS

TECHNICAL FIELD

The present disclosure relates to liquid cooling devices, in particular to a liquid immersion cooling apparatus.

BACKGROUND

With the advent of the era of big data and the continuous development of cloud technology, all walks of life have increasingly high requirements for high-performance servers, which not only improve an integration and a computing speed, but also greatly increase a heat flow density and heat generation. The conventional air cooling technology cannot meet a heat dissipation requirement. In order to avoid device performance degradation due to insufficient heat dissipation, liquid cooling technology with higher heat dissipation efficiency is required. In Immersion liquid cooling technology, the heating elements of a server, such as central processing unit (CPU), graphics processing unit (GPU), and dual in-line memory module (DIMM) are immersed in fluorinated liquid directly. Fluorinated liquid with high boiling point takes away the heat generated by each heating element, transfers the heat to other cooling media or cooling equipment in the external heat exchanger, and then returns to the cabinet for circulation to dissipate heat.

However, the fluorinated liquid at high temperature will continue to evaporate in a closed space, when a saturated humidity of the fluorinated liquid vapor is reached, the fluorinated liquid vapor will occur condensation on a surface of an upper cover of a cabinet with low temperature. The fluorinated liquid vapor with saturated humidity may leak out from a gap after contacting with the surface of the upper cover to produce condensation, and the leaked fluorinated liquid cannot continue to participate in a circulation of the heat dissipation, resulting in waste or loss of resources. In addition, when the upper cover is opened, the fluorinated liquid condensed on the surface of the upper cover may flow out along the surface of the upper cover, and the fluorinated liquid cannot return to the cabinet, causing waste or loss of resources. In addition, condensation occurs on a glass surface of the upper cover will block the vision, affecting a monitoring of internal conditions of the cabinet by an operator. Therefore, how to solve a problem of condensation has become a major design issue.

SUMMARY

The present disclosure provides an liquid immersion cooling apparatus to allow a coolant vapor in a cabinet condenses on a cooling coiled tube in the cabinet and drips back into the cabinet to recycle the coolant, thereby avoiding the waste caused by the loss of the first coolant in the gap or the loss of the first coolant when the cover is opened because the vapor of the coolant condenses on the cover, and preventing the coolant from condensing on a surface of a glass cover of the cabinet to block an operator's view of monitoring an inside of the cabinet.

A liquid immersion cooling apparatus is configured to store a first coolant and dissipate heat from a heat generating device through the first coolant. The liquid immersion cooling apparatus includes a box, a cover and a refrigeration device. The cover and the box cooperatively form a closed space, the closed space includes a liquid storage space configured to accommodate the first coolant and the heat generating device and a gas storage space. The cover has a transparent window, the enclosed space is exposed through the transparent window. The refrigeration device is located in the gas storage space. The refrigeration device includes a coiled tube, a liquid-cooled heat exchanger and a cooling chip. The liquid-cooled heat exchanger is connected to the coiled tube to form a first circulation channel configured to accommodate a second coolant. The cooling chip includes a hot end and a cold end, the cold end is thermally coupled to the liquid-cooled heat exchanger.

According to above-mentioned the liquid immersion cooling apparatus, since the refrigeration equipment is provided in the gas storage space, when the vapor of the coolant rises towards the cover, the vapor of the coolant will be firstly condensed on the coiled tube rather than on the cover. In this way, the vapor of the coolant condensed on the coiled tube will first drip back into the liquid storage space, which can not only reduce the waste of coolant, but also reduce the amount of coolant attached to the transparent window, so that an operator can clearly monitor an inside of the apparatus through the transparent window.

These and other objects, advantages, purposes and features will become apparent upon review of the following specification in conjunction with the drawings.

DETAILED DESCRIPTION OF THE EMBODIMENTS

Figure 1:
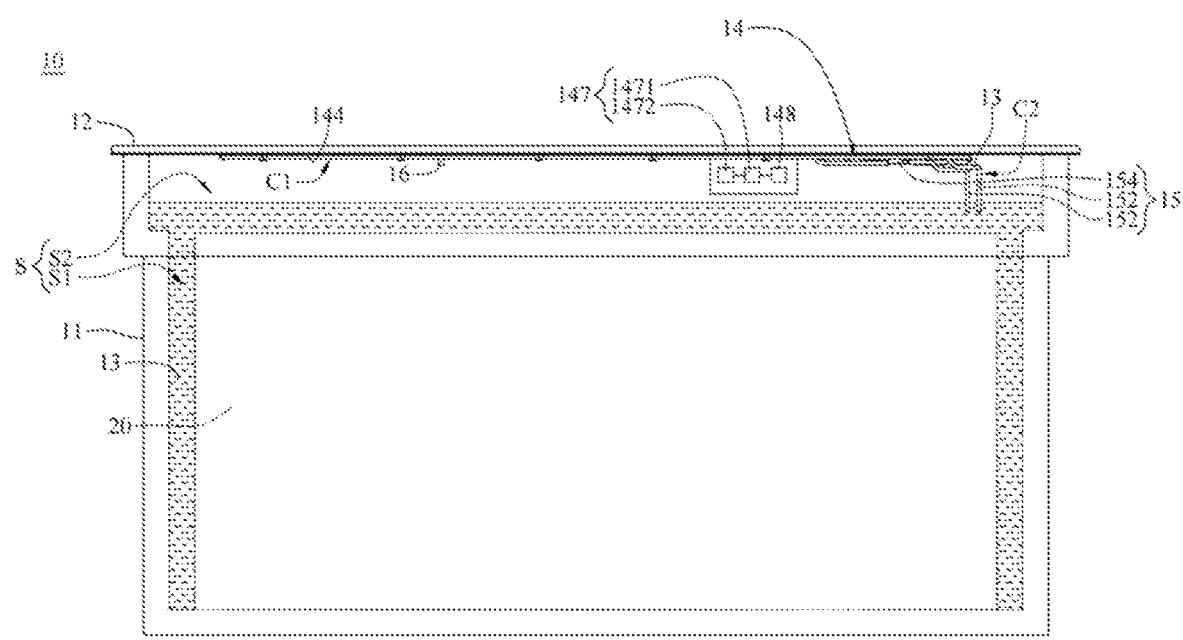
FIG. 1 is a front view of a liquid immersion cooling apparatus according to a first embodiment of the present disclosure.
Figure 2:
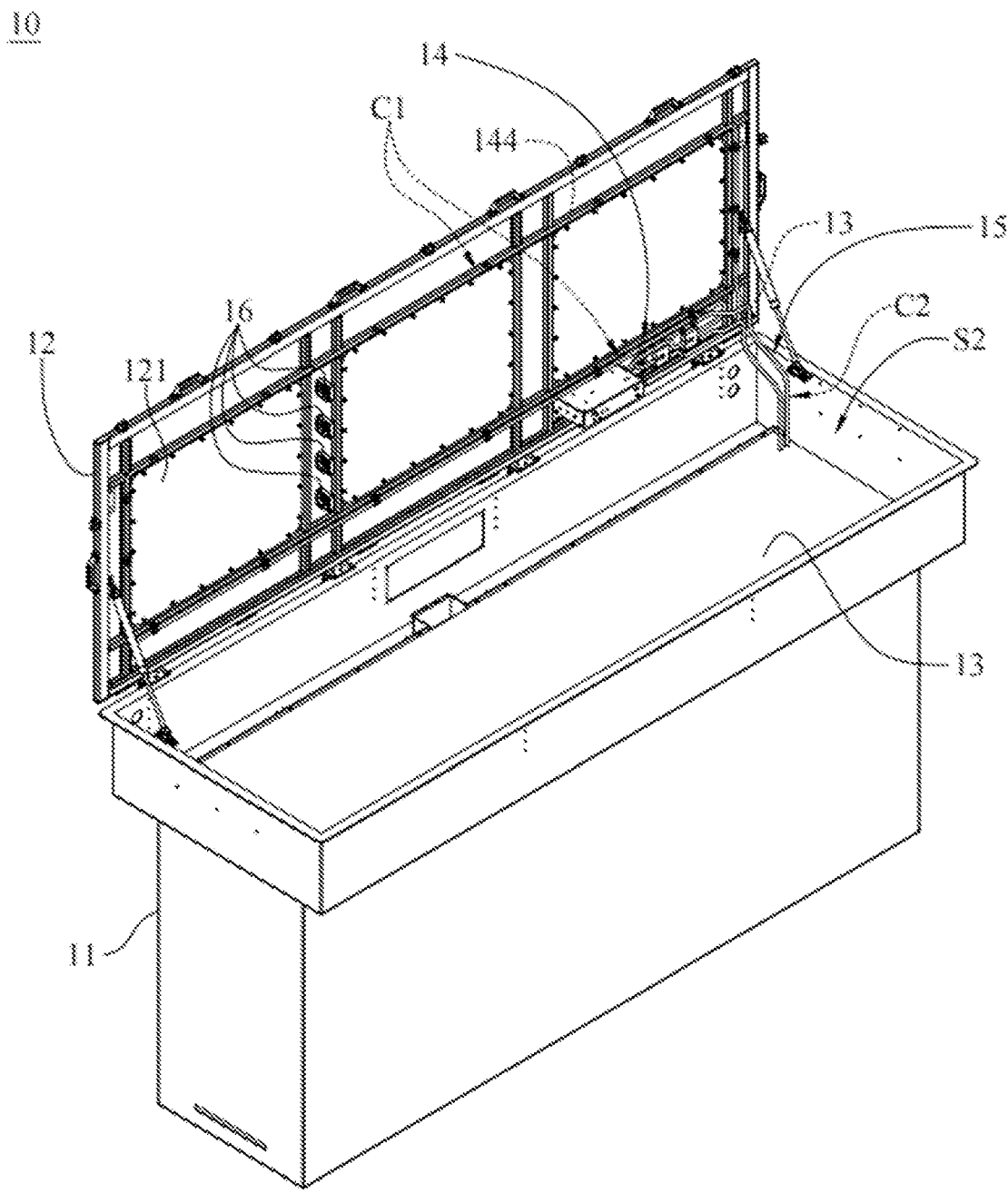
FIG. 2 is a perspective view of the liquid immersion cooling apparatus in FIG. 1 with a cover being opened.
Figure 3:
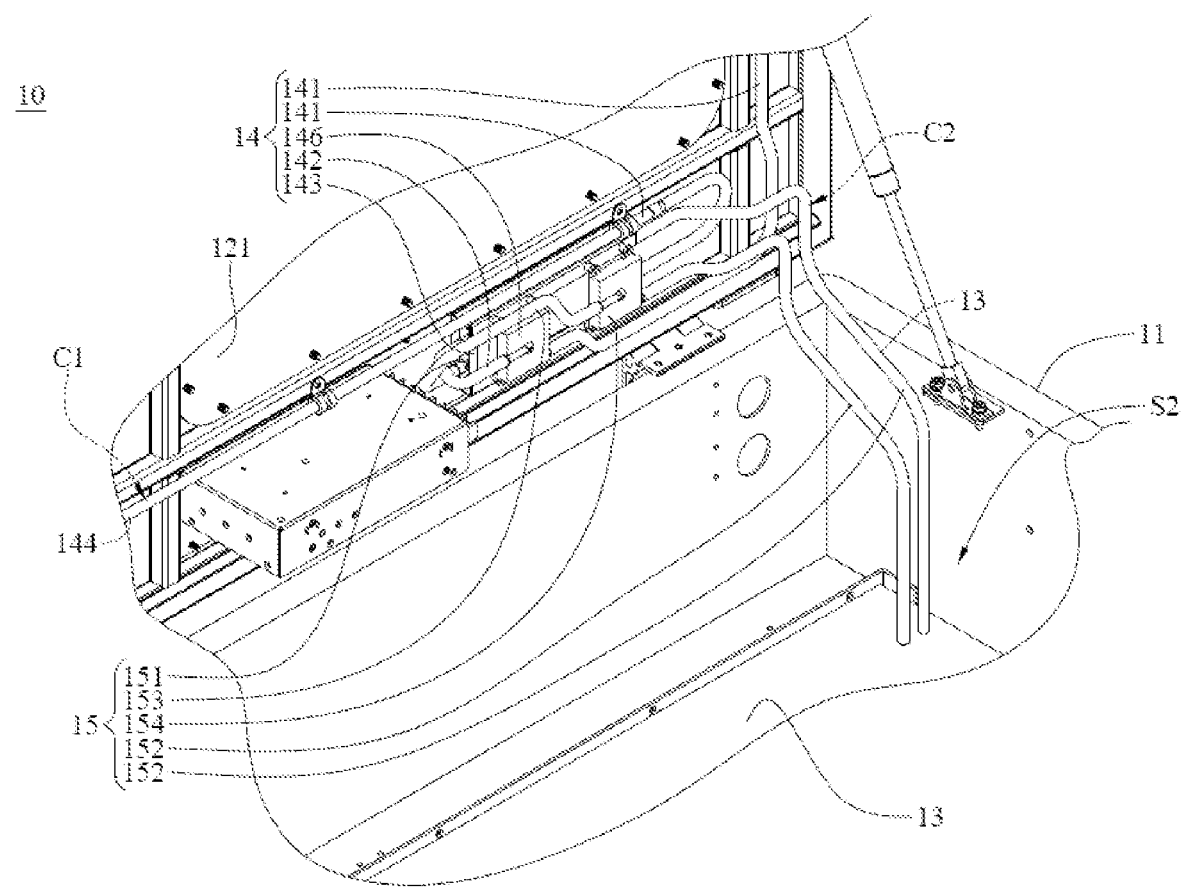
FIG. 3 is a partial enlarged view of FIG. 2.

Referring to FIGS. 1 to 3, FIG. 1 is a front view of a liquid immersion cooling apparatus according to a first embodiment of the present disclosure. FIG. 2 is a perspective view of the liquid immersion cooling apparatus in FIG. 1 with a cover being opened. FIG. 3 is a partial enlarged view of FIG. 2.

The liquid immersion cooling apparatus 10 includes a box 11, a cover 12, and a refrigeration device 14. The cover 12 is detachably connected to the box 11, and the cover 12 and the box 11 cooperatively form a closed space S. The closed space S can be divided into a liquid storage space S1 and a gas storage space S2. The liquid storage space S1 is configured to accommodate a first coolant 13 and a plurality of heat generating devices 20. The first coolant 13 can be, for example, fluorinated liquid or water. The heat generating device 20 is, for example, a server. The plurality of heat generating devices 20 are immersed in the first coolant 13, and the first coolant 13 can take away the heat generated by the plurality of heat generating devices 20.

Figure 4:
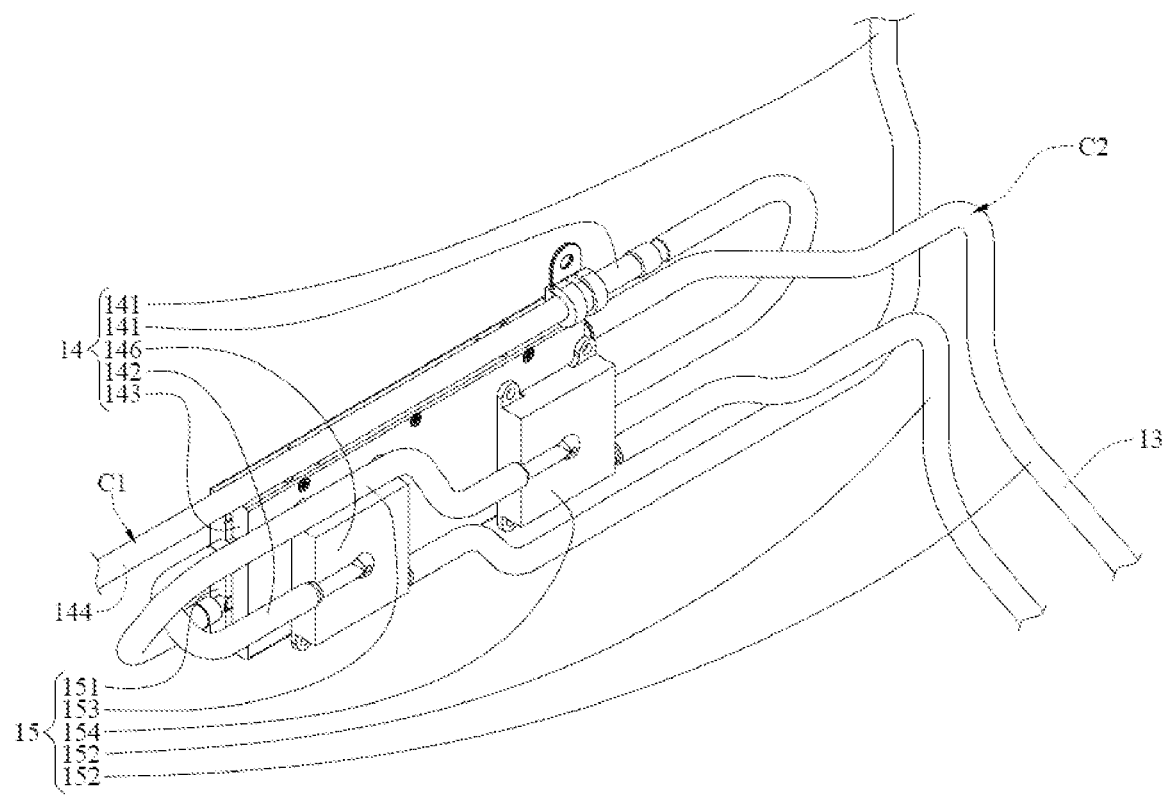
FIG. 4 is an enlarged view of a refrigeration device of FIG. 3.
Figure 5:
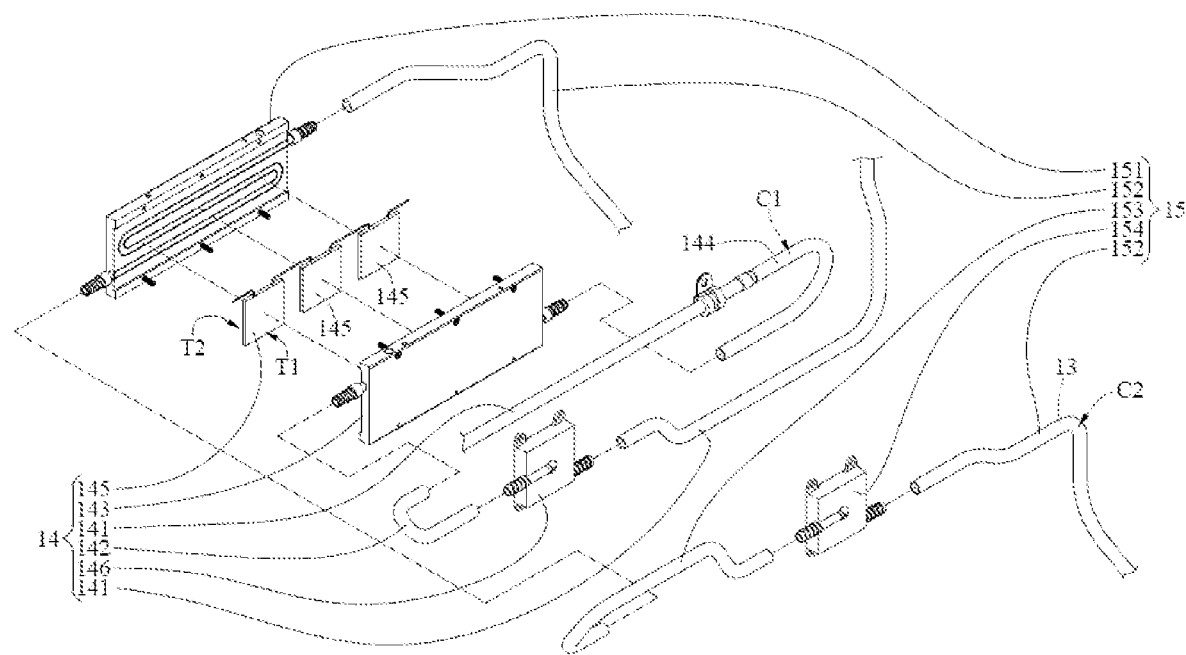
FIG. 5 is an exploded view of FIG. 4.

Referring to FIGS. 3 to 5. FIG. 3 is a partial enlarged view of FIG. 2. FIG. 4 is an enlarged view of a refrigeration device of FIG. 3. FIG. 5 is an exploded view of FIG. 4.

The refrigeration device 14 is located in the gas storage space S2. The refrigeration device 14 comprises a coiled tube 141, a first connecting pipe 142, a first liquid-cooled heat exchanger 143, a cooling chip 145, and a first pump 146. The coiled tube 141 surrounds a periphery of a transparent window 121. The first connecting pipe 142 is connected to the first liquid-cooled heat exchanger 143 and the first pump 146. The first liquid-cooled heat exchanger 143, the coiled tube 141, the first connecting pipe 142, and the first pump 146 are connected to form a first circulation channel C1. The first circulation channel C1 is configured to accommodate a second coolant 144. The second coolant 144 can be, for example, fluorinated liquid or water. The first pump 146 drives the second coolant 144 to circulate in the first circulation channel C1.

The cooling chip 145 has a cold end T1 and a hot end T2. The cold end T1 of the cooling chip 145 is thermally coupled to the first liquid-cooled heat exchanger 143. The thermal coupling means transferring heat through thermal conduction, thermal convection or thermal radiation. In this way, when the cooling chip 145 operates, the cold end T1 of the cooling chip 145 will continuously cool the second coolant 144 in the first circulation channel C1 through the first liquid-cooled heat exchanger 143. Next, the cooled second coolant 144 flows through the coiled tube 141 to reduce a temperature of the coiled tube 141. Since the temperature of the coiled tube 141 is reduced by the cooled second coolant 144, when a vapor of the first coolant 13 rises towards the cover 12, it will firstly be condensed on the coiled tube 141 of the refrigeration device 14, rather than on the cover 12. Therefore, the condensed first coolant 13 will drip back into the liquid immersion cooling apparatus 10.

The liquid immersion cooling apparatus 10 may also include the transparent window 121. The transparent window 121 is located on the cover 12. The closed space S can be observed through the transparent window 121. The coiled tube 141 of the refrigeration device 14 is located on a side of the transparent window 121, for example, the coiled tube 141 surrounds a periphery of the transparent window 121. Alternatively, the coiled tube 141 is wholly or partially located between the transparent window 121 and the first coolant 13. In this way, an operator can monitor the internal conditions of the apparatus through the transparent window 121.

In other embodiments, the transparent window 121 may also be located on the box 11. It should be understood that, the transparent window 121 may be omitted.

The liquid immersion cooling apparatus 10 may also include a heat dissipation device 15 configured to dissipate heat from the hot end T2 of the cooling chip 145. The heat dissipation device 15 includes a second liquid-cooled heat exchanger 151, a cooling pipe 152, a second connecting pipe 153, and a second pump 154. The second connecting pipe 153 is connected between the second liquid-cooled heat exchanger 151 and the second pump 154. The second liquid-cooled heat exchanger 151, the cooling pipe 152, the second connecting pipe 153, the second pump 154, and the box 11 are connected to form a second circulation channel C2. The second circulation channel C2 is configured to accommodate the first coolant 13. The hot end T2 of the cooling chip 145 is thermally coupled to the second liquid-cooled heat exchanger 151. The second pump 154 drives the first coolant 13 to circulate in the second circulation channel C2, so that the first coolant 13 flows through the second liquid-cooled heat exchanger 151, and the first coolant 13 dissipates heat on the hot end T2 of the cooling chip 145 through the second liquid-cooled heat exchanger 151. In this way, the hot end T2 of the cooling chip 145 is continuously cooled through the first coolant 13 in the second circulation channel C2, so that it can continue to operate without causing damage to the cooling chip 145 due to a high temperature of the hot end T2.

In this embodiment, since the refrigeration device 14 is located in the gas storage space S2, it can be located on the side of the cover 12 adjacent to the first coolant 13. In this way, when the vapor of the first coolant 13 rises towards the cover 12, it will firstly be condensed on the coiled tube 141, rather than on the cover 12. Therefore, the waste of the first coolant 13 caused by the vapor of the first coolant 13 condensing on the cover 12 or the loss of the first coolant 13 when the cover 12 is opened can be avoided, and the amount of the first coolant 13 attached to the transparent window 121 can also be reduced, so that the operator can clearly monitor an inside of the liquid immersion cooling apparatus 10 through the transparent window 121. In addition, the heat dissipation device 15 of the liquid immersion cooling apparatus 10 can circularly cool the hot end T2 of the cooling chip 145, so that the cooling chip 145 can work normally and constantly without being damaged due to excessive temperature.

The refrigeration device 14 may also include a temperature control device 147. The temperature control device 147 includes a temperature sensor 1471 and a temperature control device 1472. The temperature sensor 1471 is thermally coupled to the cooling chip 145 and can be configured to sense a current temperature of the cooling chip 145. The temperature control device 1472 is electrically connected to the cooling chip 145, and can be configured to control the temperature of the cooling chip 145 according to the current temperature of the cooling chip 145 sensed by the temperature sensor 1471. It should be understood that, n other embodiments, the temperature control device 147 may be omitted.

In this embodiment, the liquid immersion cooling apparatus 10 may also include a fan 16. The fan 16 is located in the gas storage space S2. The fan 16 can generate a disturbing air flow that drives the vapor of the first coolant 13 in the gas storage space S2 to circulate. In this way, the vapor of the first coolant 13 located everywhere in the gas storage space S2 can quickly reach a uniform temperature, so that the vapor of the first coolant 13 can be uniformly condensed on the coiled tube 141 and drip back into the liquid storage space S1.

In this embodiment, one fan 16 is provided in the liquid immersion cooling apparatus 10, but not limited hereto. In other embodiments, the number of fans may also be multiple, or the liquid immersion cooling apparatus may also be provided without the fan.

The refrigeration device 14 may also include a circuit 148. The circuit 148 is electrically connected to the cooling chip 145 and configured to supply power to the cooling chip 145, so that the cooling chip 145 is energized to form the cold end T1 and the hot end T2.

Figure 6:
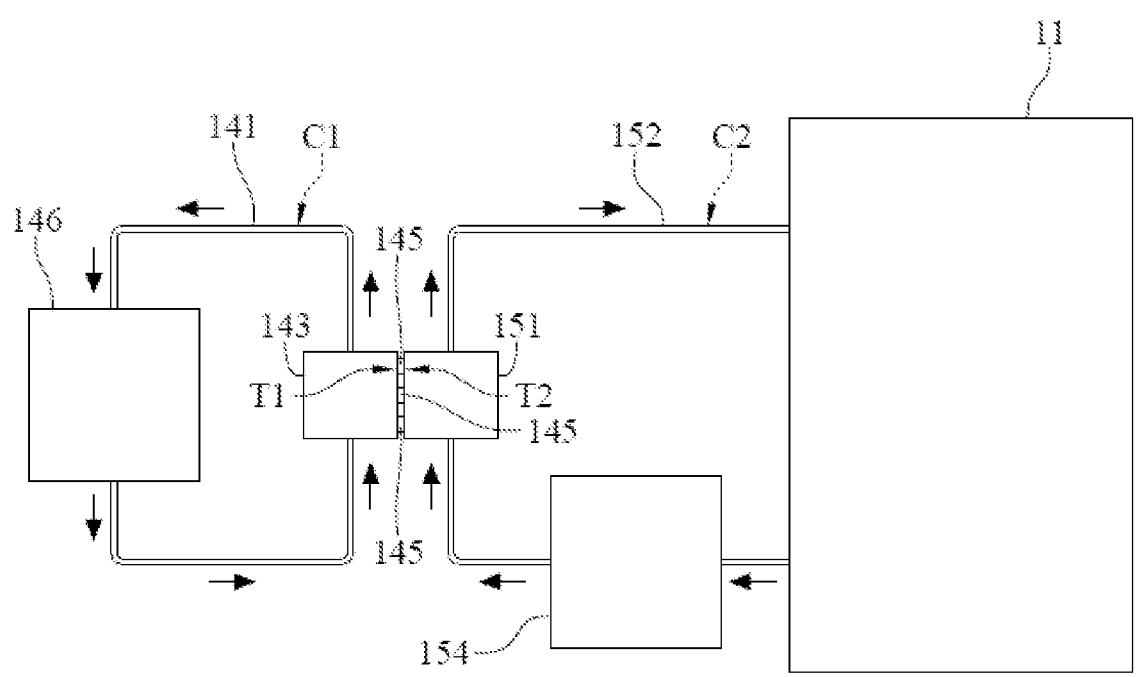
FIG. 6 is a schematic diagram of a cooling cycle system of the refrigeration device and a heat dissipation device in FIG. 1.

Referring to FIG. 6, FIG. 6 is a schematic diagram of a cooling cycle system of the refrigeration device and a heat dissipation device in FIG. 1.

In this embodiment, the cold end T1 of the cooling chip 145 is thermally coupled to the first liquid-cooled heat exchanger 143, so as to cool the second coolant 144 flowing through the first liquid-cooled heat exchanger 143. In this way, the cooled second coolant 144 flows through the coiled tube 141 and cools the coiled tube 141, so that the temperature of the coiled tube 141 is lower than the temperature of the vapor of the first coolant 13. Therefore, the vapor of the first coolant 13 will be condensed on the coiled tube 141, rather than on the surface of the cover 12.

In this embodiment, the hot end T2 of the cooling chip 145 is thermally coupled to the second liquid-cooled heat exchanger 151, and the first coolant 13 in the second circulation channel C2 flows through the second liquid-cooled heat exchanger 151, and cools the hot end T2 of the cooling chip 145. In this way, the hot end T2 of the cooling chip 145 can be continuously cooled through the first coolant 13 without causing damage to the cooling chip 145 due to the high temperature of the hot end T2 of the cooling chip 145.

According to above-mentioned the liquid immersion cooling apparatus, since the refrigeration equipment is provided in the gas storage space, when the vapor of the coolant rises towards the cover, the vapor of the coolant will be firstly condensed on the coiled tube rather than on the cover. In this way, the vapor of the coolant condensed on the coiled tube will first drip back into the liquid storage space, which can not only reduce the waste of coolant, but also reduce the amount of coolant attached to the transparent window, so that an operator can clearly monitor an inside of the apparatus through the transparent window.

The above-mentioned embodiments do not constitute a limitation on the protection scope of the technical solution. Any modifications, equivalent replacements and improvements made within the spirit and principles of the above-mentioned embodiments shall be included within the protection scope of this technical solution.

What is claimed is:

1. A liquid immersion cooling apparatus configured to store a first coolant and dissipate heat from a heat generating device through the first coolant, the liquid immersion cooling apparatus comprising:
    a box;
    a cover, the cover and the box cooperatively forming a closed space, the closed space comprising a liquid storage space configured to accommodate the first coolant and the heat generating device and a gas storage space; and
    a refrigeration device located in the gas storage space and comprising:
        a coiled tube;
        a first liquid-cooled heat exchanger connected to the coiled tube to form a first circulation channel configured to accommodate a second coolant; and
        a cooling chip comprising a hot end and a cold end, wherein the cold end is thermally coupled to the first liquid-cooled heat exchanger.

2. The liquid immersion cooling apparatus according to claim 1, further comprises a transparent window located on the box or on the cover, wherein the coiled tube is located on a side of the transparent window.

3. The liquid immersion cooling apparatus according to claim 1, wherein the refrigeration device comprises a first pump connected to the coiled tube and configured to drive the second coolant to circulate in the first circulation channel.

4. The liquid immersion cooling apparatus according to claim 3, further comprising a heat dissipation device comprising a second liquid-cooled heat exchanger and a cooling pipe, wherein the hot end of the cooling chip is thermally coupled to the second liquid-cooled heat exchanger, and the second liquid-cooled heat exchanger, the cooling pipe, and the box are connected to form a second circulation channel configured to accommodate the first coolant.

5. The liquid immersion cooling apparatus according to claim 4, wherein the heat dissipation device comprises a second pump connected to the cooling pipe and configured to drive the first coolant to circulate in the second circulation channel.

6. The liquid immersion cooling apparatus according to claim 1, wherein the refrigeration device comprises a temperature control device, the temperature control device comprises a temperature sensor and a temperature control device, the temperature sensor is thermally coupled to the cooling chip and configured to sense a current temperature of the cooling chip, the temperature control device is electrically connected to the cooling chip and configured to control a temperature of the cooling chip according to the current temperature of the cooling chip sensed by the temperature sensor.

7. The liquid immersion cooling apparatus according to claim 1, further comprises a fan located in the gas storage space, wherein the fan is configured to generate a disturbing air flow that drives a gas in the gas storage space to circulate.

8. The liquid immersion cooling apparatus according to claim 1, wherein the refrigeration device comprises a circuit electrically connected to the cooling chip and configured to supply power to the cooling chip.

9. The liquid immersion cooling apparatus according to claim 4, wherein the first coolant is fluorinated or water.

10. The liquid immersion cooling apparatus according to claim 1, wherein the second coolant is fluorinated or water.

* * * * *